(12) United States Patent
Tolson

(10) Patent No.: US 7,127,226 B2
(45) Date of Patent: Oct. 24, 2006

(54) TWIN-T DUAL NOTCH FILTER

(75) Inventor: Nigel J. Tolson, Reading (GB)

(73) Assignee: Matsushita Electric Industrial Co., Ltd., Osaka (JP)

( * ) Notice: Subject to any disclaimer, the term of this patent is extended or adjusted under 35 U.S.C. 154(b) by 558 days.

(21) Appl. No.: 10/040,535

(22) Filed: Dec. 28, 2001
(Under 37 CFR 1.47)

(65) Prior Publication Data

US 2003/0125004 A1    Jul. 3, 2003

(51) Int. Cl.
*H04B 1/10* (2006.01)

(52) U.S. Cl. ............... 455/296; 455/307; 455/306; 327/551; 327/556

(58) Field of Classification Search ............... 455/296, 455/188.1, 575.1, 550.1, 63.1, 306, 307, 455/302, 67.13, 334, 337, 339, 425, 426, 455/456.5, 456.1, 285, 286, 283, 304, 305, 455/561, 570, 114.1, 187.1, 197.3, 278.1, 455/319, 213; 333/70, 75, 28, 167, 175, 333/202, 28 R, 174–176, 170, 172, 134, 333/204, 133, 185, 190, 193, 195, 165–166, 333/173; 327/556, 552, 557, 558, 553–555, 327/559, 551; 348/21; 370/85.3, 85.2, 94.1; 375/346, 285, 319, 321, 340, 344, 329, 298, 375/233; 379/52, 90.01; 330/70, 80, 109, 330/97, 176, 107, 21, 28, 306; 340/554, 340/825, 5; 381/93, 17; 250/20.5
See application file for complete search history.

(56) References Cited

U.S. PATENT DOCUMENTS

| | | | | |
|---|---|---|---|---|
| 3,577,179 A | * | 5/1971 | West | 330/107 |
| 3,579,135 A | * | 5/1971 | Anderson | 330/252 |
| 3,683,130 A | * | 8/1972 | Kahn | 455/575.2 |
| 5,107,491 A | * | 4/1992 | Chew | 370/445 |
| 5,587,924 A | * | 12/1996 | Rossi | 702/63 |
| 6,035,213 A | * | 3/2000 | Tokuda et al. | 455/553.1 |
| 6,370,211 B1 | * | 4/2002 | Carsello | 375/346 |
| 2002/0000874 A1 | * | 1/2002 | Thomasson | 327/552 |
| 2002/0168956 A1 | * | 11/2002 | Murtojarvi | 455/296 |
| 2003/0087622 A1 | * | 5/2003 | Jayaraman et al. | 455/307 |

* cited by examiner

*Primary Examiner*—Edward F. Urban
*Assistant Examiner*—Charles Chow
(74) *Attorney, Agent, or Firm*—McDermott Will & Emery LLP

(57) ABSTRACT

A communication filter circuit useful in a dual-mode receiver comprises a cascade of an active twin-T filter and a passive twin-T filter sections defining sharp notches at the center of second adjacent and of third adjacent channels, respectively, and specifically providing most attenuation at 60 kHz and at 90 kHz, for operation in the ISM136 band which has 30 kHz channel spacing. Since communication is channelized and limited in bandwidth, an active/passive twin-T notch filter structure is effective for signal attenuation. In a circuit in which real and imaginary signal components are processed, active-passive twin-T filters are provided in each of four signal paths, namely I and –I, Q and –Q.

10 Claims, 3 Drawing Sheets

US 7,127,226 B2

TWIN-T DUAL NOTCH FILTER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

This invention relates to image and unwanted signal rejection in portable dual mode receiver circuits. The invention has particular application to cellular telephone technology wherein a single compact battery powered receiver must be able to operate on at least two disparate frequency bands with different channel spacing. In particular, the invention relates to problems associated with conversion and rejection of signals for digital cellular telephones operative in the AMP/PCS/GSM/EDGE bands (850 MHz, 900 MHz, 1900 MHz bands) which have 200 kHz channel spacing and in the IS136 band (~850 MHz band) which has 30 kHz channel spacing.

There is a need to minimize avoidable components to save power and space in critical applications such as miniature portable cellular receiver circuit devices. The challenge is to provide rejection of unwanted signals and images at the input into the digital subsystem.

Many signal conversion systems with passive low-pass filters of sufficiently steep rolloff to attenuate adjacent and next-adjacent channels or images are difficult to realize. The spacing of the channels or signals and images is such that energy is often well within the skirts of a typical rolloff characteristic of a passive low-pass filter.

What is therefore needed is a filter circuit which provides adequate signal rejection at frequencies of interest and yet which is simple to realize and construct in the context of mass manufacturing.

Active twin-T filters and passive twin-T filters are known. However, their use in combination or as alternatives in the same circuit is not.

SUMMARY OF THE INVENTION

According to the invention, a communication filter circuit useful in a dual-mode superheterodyne receiver comprises a cascade of an active twin-T filter and a passive twin-T filter section each defining sharp notches at the center of adjacent and of next adjacent channels, respectively, and specifically providing most attenuation at 60 kHz and at 90 kHz for operation with signals converted from frequencies in the 800–3000 MHz spectrum. Specifically in a circuit for detecting the ISM136 band which has 200 kHz channel spacing a passive twin-T circuit section is employed and in the GSM bands which have a 30 kHz channel spacing, an active twin-T circuit is used. Since communication is channelized and limited in bandwidth, an active/passive twin-T notch filter structure is effective for the intended spurious signal attenuation. In a circuit in which real and imaginary signal components are processed, active/passive twin-T filters are provided in each of four signal paths, namely I and I, as well as Q and Q.

The invention will be better understood by reference to the following detailed description in connection with the accompanying drawings.

DETAILED DESCRIPTION OF THE INVENTION

Figure 1:
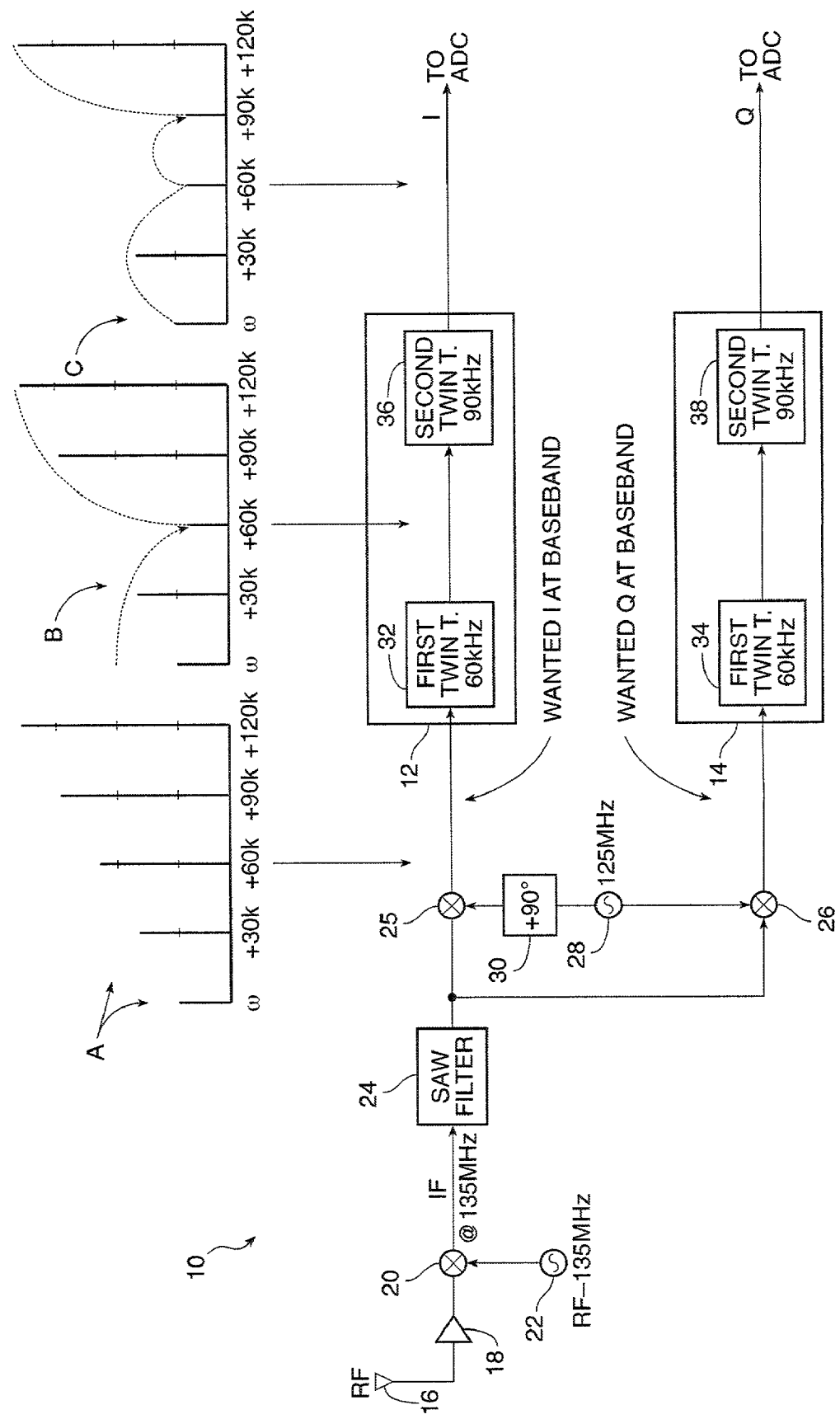
FIG. 1 is a block diagram of a circuit incorporating the invention.

Referring to FIG. 1, there is shown a simplified diagram of a down-converting receiver 10 with a pair of dual twin—T notch filter sections 12, 14 to extract in-phase (I) and quadrature-phase (Q) components of a signal downconverted to baseband. RF energy received through an antenna 16 is amplified by amplifier 18 and mixed down to an intermediate frequency band (IF) at 135 MHz through a first mixer 20 which outputs the product of the RF signal and a mixer signal from a first stable signal source 22 at a frequency of the nominal RF frequency less the IF frequency (RF-135 MHz) The IF signal is processed through a surface acoustic wave (SAW) filter 24 to reject the image. The signal is then split for I and Q processing and applied to respective second and third mixers 25, 26. The outputs (as indicated in the first spectrum graph A of FIG. 1) are each the products at baseband of the IF input and a second stable source 28 operative at 135 MHz. The first output is offset by 90 degrees as a consequence of a quadrature (+90 degree) phase shift introduced by a phase shifter 30. In each channel, an active first twin-T notch filter 32, 34 (as hereinafter described) introduces a null at the second adjacent channel position (60 kHz) (as indicated in the second spectrum graph B of FIG. 1). Similarly, in each channel, a passive second twin-T notch filter 36, 38 (as hereinafter described) introduces a null at the third adjacent channel position (90 kHz) (as indicated in the second spectrum graph B of FIG. 1). The outputs are the desired I and Q component signals which are then applied to respective analog to digital converters (not shown) for further processing as digital values. Further selectivity can be achieved with a digital finite impulse response (FIR) filter (not shown) to address adjacent channel interference.

Figure 2:
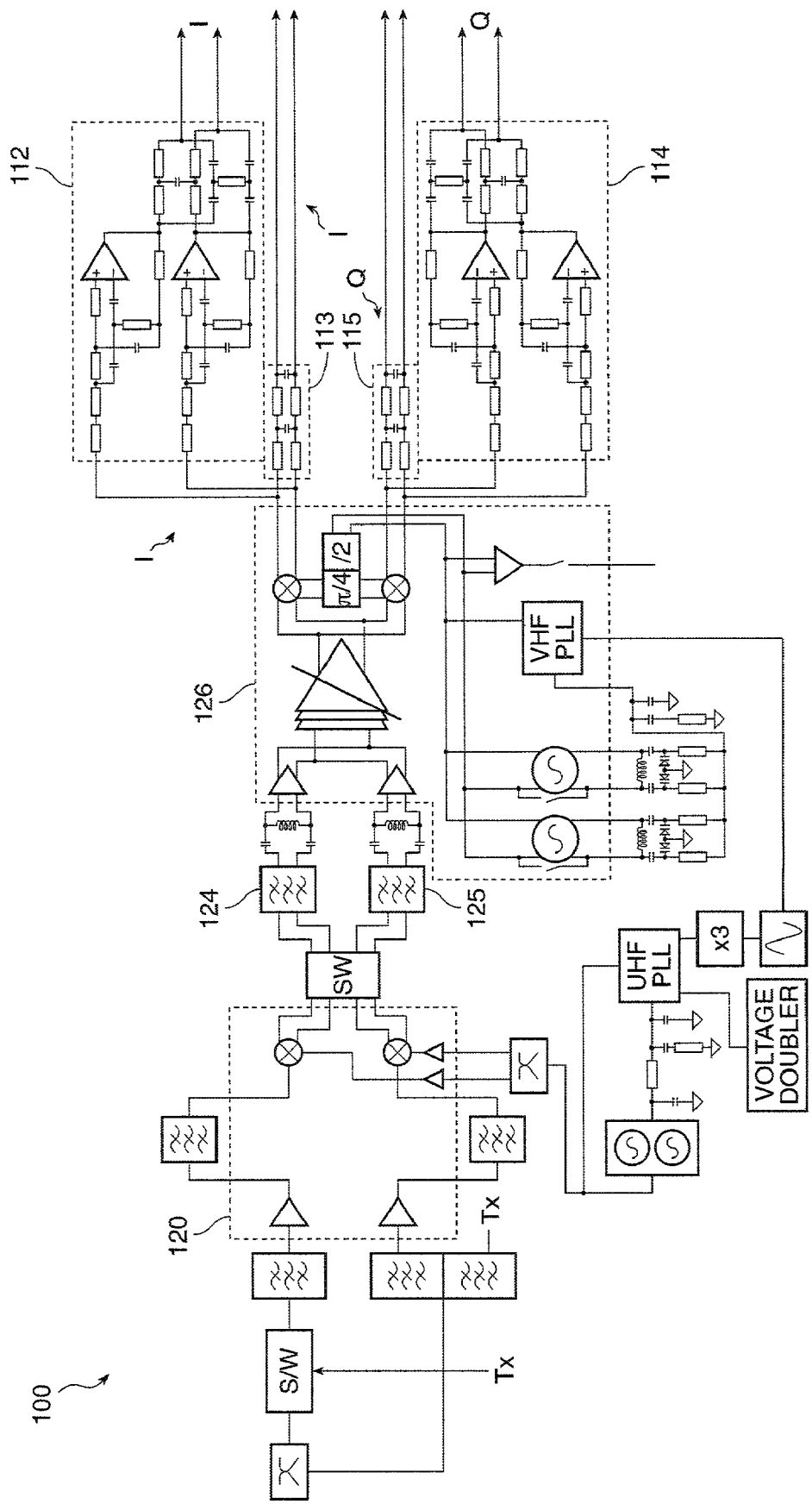
FIG. 2 is a schematic diagram of a circuit implementation of a circuit according to the invention.

FIG. 2 illustrates a specific dual mode receiver circuit 100 which incorporates dual active/passive twin T circuits 112, 114 when operating in its IS-136 mode and single passive notch filter section circuits 113, 115. The RF signal is processed in a commercially-available combination LNA/mixer chip 120 whose outputs are directed either through a first SAW filter 124 or a second SAW filter 125. The outputs are provided to a commercially-available quad demodulator chip 126 operative to downconvert and divide the source signals into baseband frequency I and Q components from the respective IF source frequencies. The I and Q components at the IS-136 band are processed through the dual twin-T filters 112, 114. The GSMK/EDGE signals, whose channel spacing does not require the sharp rolloff of signals, are processed through the passive notch filter networks 113, 115.

Figure 3:
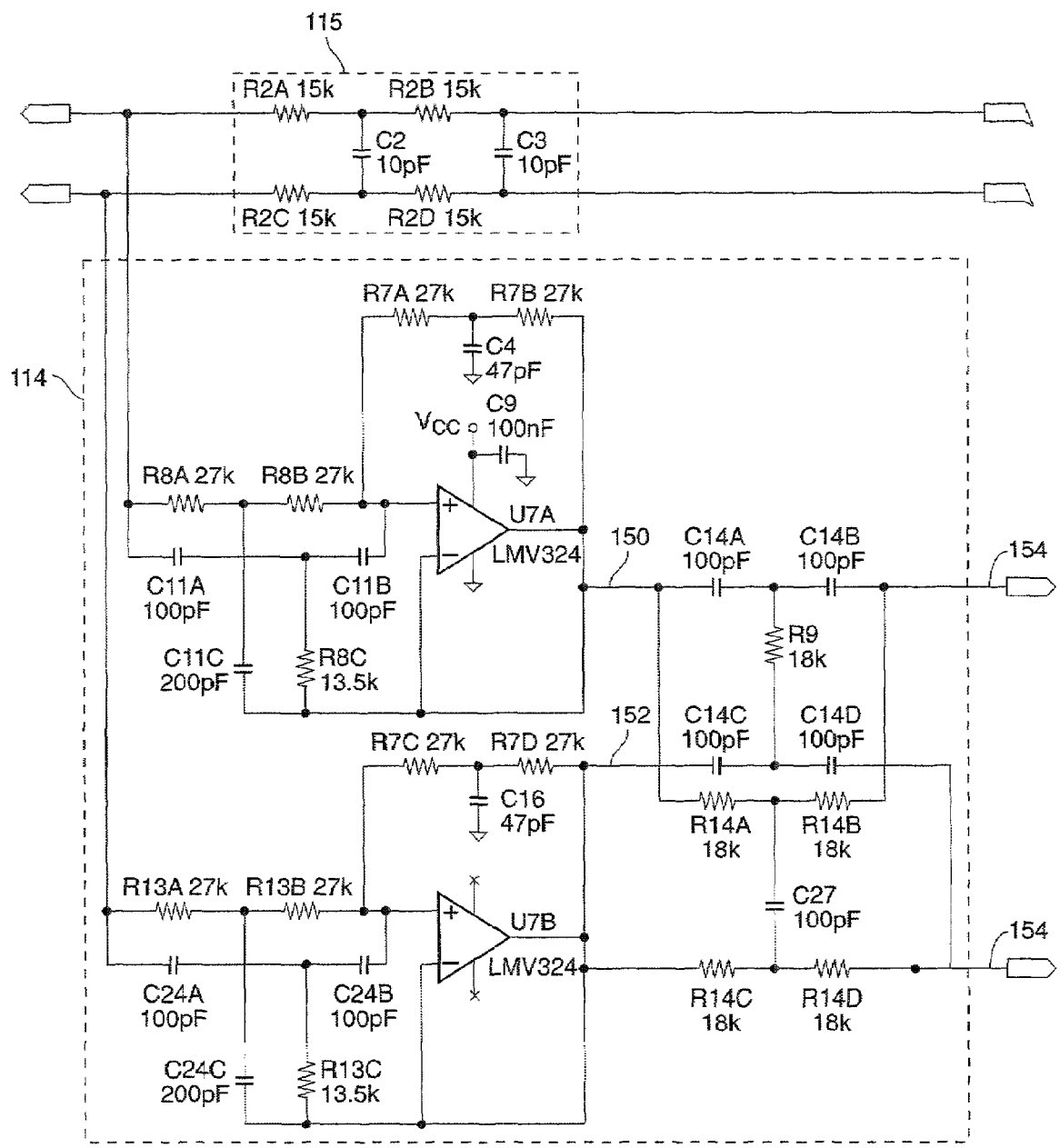
FIG. 3 is a circuit diagram of a combination of active and passive twin-T sections.

As an example, the dual active/passive twin T circuit 114 and the lowpass filter 115 for the Q signal path are illustrated in FIG. 3 for a specific embodiment. (The I signal path is identical, as can be seen from FIG. 2). Each of the active sections is built around a conventional operational amplifier U7A and U7B. Active twin T sections comprise, in one-half of the differential set, series capacitors C24A, C24B split by a shunt resistor R 13C to the inverting input and series resistors R13A, R13B split by a shunt capacitor C24C to the inverting input are disposed at the respective inverting and non inverting inputs. In the feed-forward loop, a T-section is provided of series resistors R7C and R7D split by a shunt capacitor C16 to ground. The topology of the active twin-T circuit is called an active bootstrap configuration. It allows for enhanced Q as compared to other configurations. An identical topology is provided for the differential side of the circuit. Specific component values are called out for a 60 kHz notch.

The passive twin-T sections are used in a balanced configuration which comprises two parallel differential inputs 150, 152 each split into two paths according to the twin-T topology. For the first differential input 150, a first pair of series capacitors C14A, C14B are split by resistor R9 coupled to split a second pair of series capacitors C14C, C14D which are off of the second differential input 152. Similarly, for the first differential input 150, a first pair of series resistors R14A, R14B are split by capacitor C27 coupled to split a second pair of series resistors R14C, RC14D which are off of the second differential input 152. The first capacitor pair is shunted across by the first resistor pair to form a node of a first differential output 154. The second capacitor pair is shunted across by the second resistor pair to form a node of a second differential output 156. The resistance and capacitance values called out are suitable for a 90 kHz notch.

The group delay of the active notch filter is less than that of the passive notch filter so that the slope of the active notch can be steeper without resulting in filter instability, thus accommodating wanted signals while suppressing unwanted signals at adjacent. channels, particularly, second adjacent channels, in a system of closely spaced channels.

The invention has been explained with reference to specific embodiments. Other embodiments will be evident to those of ordinary skill in the art. It is therefore not intended that this invention be limited, except as indicated by the appended claims.

What is claimed is:

1. A filter circuit apparatus for suppression of spurious signals in a superheterodyne circuit for receiving communication in channels comprising:
   a first analog active twin-T filter in a first signal path defining a first sharp notch at the center a second adjacent channel; and
   a first analog passive twin-T filter section coupled to receive output of the first analog active twin-T filter, defining a second sharp notch at the center of a next adjacent channel, to suppress spurious signals at frequencies of modulation product.

2. The apparatus of claim 1 wherein said superheterodyne circuit employs an in-phase and a quadrature phase signal path, said first signal path corresponding to said in-phase signal path, the apparatus further including:
   a second analog active twin-T filter in a second signal path defining said first sharp notch at the center the second adjacent channel, said second signal path corresponding to a quadrature phase signal path; and
   a second analog passive twin-T filter section coupled to receive output of the second analog active twin-T filter, defining said second sharp notch at the center of a next adjacent channel, to suppress spurious signals at frequencies of modulation product.

3. The circuit according to claim 2 wherein said superheterodyne circuit employs differentials feed in each one of said first signal path and said second signal path, the apparatus further including:
   a third analog active twin-T filter in a third signal path defining said first sharp notch at the center the second adjacent channel, said third signal path comprising a differential of said in-phase signal path;
   a third analog passive twin-T filter section coupled to receive output of the third analog active twin-T filter, defining said second sharp notch at the center of a next adjacent channel, to suppress spurious signals at frequencies of modulation product, said third analog passive twin-T section being cross coupled with said first analog passive twin-T section;
   a fourth analog active twin-T filter section to receive output of the fourth analog active twin-T filter, defining said second sharp notch at the center of a next adjacent channel, to suppress spurious signals at frequencies of modulation product, said fourth analog passive twin-T section being cross coupled with said second analog passive twin-T section.

4. The apparatus according to claim 3 wherein each active twin-T section is in active bootstrap configuration.

5. The apparatus according to claim 1 wherein the active twin-T section is in active bootstrap configuration.

6. A method for processing multiple signal modes according to different radio standards of a received RF signal, comprising:
   performing downconversion of the received RF signal to produce analog I and Q signals; and for each of the analog I signal and the analog Q signal, filtering out unwanted signals by:
      for a first standard, processing the analog signal using a first passive notch filter to produce a first filtered signal; and
      for a second standard, processing the analog signal using an active notch filter to produce a second filtered signal;
      wherein the active notch filter exhibits smaller group delay than the passive notch filter.

7. The method according to claim 6 further includes, for the second standard, processing the second filtered signal using a second passive notch filter to produce a third filtered signal.

8. A dual mode communications receiver, comprising:
   a demodulator operable to provide in-phase and quadrature-phase base band signals;
   a first active twin-T filter having an input coupled to an in-phase output of said demodulator;
   a first passive notch filter network having an input coupled to the in-phase output of said demodulator;
   a second active twin-T filter having an input coupled to a quadrature-phase output of said demodulator; and
   a second passive notch filter network having an input coupled to the quadrature-phase output of said demodulator.

9. The dual-mode communications receiver of claim 8 wherein said first and second passive notch filters are employed to filter communications signals complying with a first standard and said first and second active twin-T filters are employed to filter communications signals complying with a second standard.

10. The dual-mode communications receiver of claim 9 wherein the first standard is characterized by a channel spacing that is greater than a channel spacing associated with the second standard.

* * * * *

UNITED STATES PATENT AND TRADEMARK OFFICE
CERTIFICATE OF CORRECTION

PATENT NO. : 7,127,226 B2 Page 1 of 1
APPLICATION NO. : 10/040535
DATED : October 24, 2006
INVENTOR(S) : Nigel J. Tolson It is certified that error appears in the above-identified patent and that said Letters Patent is hereby corrected as shown below:

IN THE CLAIMS:

Claim 3, Column 4, replace the paragraph beginning at line 16 and ending with line 22 with the following two paragraphs:

-- a fourth analog active twin-T filter in a fourth signal path defining said first sharp notch at the center the second adjacent channel, said fourth signal path comprising a differential of said quadrature-phase signal path; and a fourth analog passive twin-T filter section coupled to receive output of the fourth analog active twin-T filter, defining said second sharp notch at the center of a next adjacent channel, to suppress spurious signals at frequencies of modulation product, said fourth analog passive twin-T section being cross coupled with said second analog passive twin-T section. --.

Signed and Sealed this

Twenty-first Day of August, 2007

JON W. DUDAS
*Director of the United States Patent and Trademark Office*